US011194498B1

(12) United States Patent
Si et al.

(10) Patent No.: US 11,194,498 B1
(45) Date of Patent: Dec. 7, 2021

(54) INLINE COMPRESSION WITH SMALL-WRITE COMPRESSION AVOIDANCE

(71) Applicant: EMC IP Holding Company LLC, Hopkinton, MA (US)

(72) Inventors: Yining Si, Sherborn, MA (US); Philippe Armangau, Acton, MA (US); Ivan Bassov, Brookline, MA (US); Christopher A. Seibel, Walpole, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 723 days.

(21) Appl. No.: 15/662,676

(22) Filed: Jul. 28, 2017

(51) Int. Cl.
*G06F 16/22* (2019.01)
*G06F 3/06* (2006.01)
*G06F 16/174* (2019.01)
*H03M 7/30* (2006.01)

(52) U.S. Cl.
CPC .......... *G06F 3/0643* (2013.01); *G06F 3/0608* (2013.01); *G06F 16/1744* (2019.01); *G06F 16/22* (2019.01); *H03M 7/30* (2013.01)

(58) Field of Classification Search
CPC .................................................. G06F 3/0643
USPC ......................................................... 707/693
See application file for complete search history.

(56) References Cited

U.S. PATENT DOCUMENTS

| 5,701,516 | A | 12/1997 | Cheng et al. |
| 6,668,015 | B1 * | 12/2003 | Kranawetter ........... H03M 7/40 348/E5.108 |
| 8,190,850 | B1 | 5/2012 | Davenport et al. |
| 9,400,792 | B1 | 7/2016 | Bono et al. |
| 2006/0184505 | A1 * | 8/2006 | Kedem ................. G06F 3/0608 |
| 2010/0058002 | A1 * | 3/2010 | Voll ...................... G06F 3/0608 711/154 |
| 2011/0218974 | A1 * | 9/2011 | Amit ....................... G06F 16/00 707/693 |

OTHER PUBLICATIONS

Yannis Klonatos; Transparent Online Storage Compression at the Block-Level; ACM Transactions on Storage; vol. 8, No. 2, Article 5, Publication date May 2012; 33 pages.

\* cited by examiner

*Primary Examiner* — Hicham Skhoun
(74) *Attorney, Agent, or Firm* — BainwoodHuang

(57) ABSTRACT

A technique for performing writes in a storage system that supports data compression tests incoming writes to determine whether the amount of data to be written is less than a predetermined threshold. If so, the storage system avoids compression and stores the amount of data as received without compressing it. If not, the storage system performs compression and stores the incoming data as a compressed extent.

18 Claims, 5 Drawing Sheets

INLINE COMPRESSION WITH SMALL-WRITE COMPRESSION AVOIDANCE

BACKGROUND

Data storage systems are arrangements of hardware and software that include storage processors coupled to arrays of non-volatile storage devices, such as magnetic disk drives, electronic flash drives, and/or optical drives, for example. The storage processors service storage requests, arriving from host machines ("hosts"), which specify files or other data elements to be written, read, created, deleted, and so forth. Software running on the storage processors manages incoming storage requests and performs various data processing tasks to organize and secure the data elements stored on the non-volatile storage devices.

Some data storage systems employ data compression to improve storage efficiency. For example, a software program running on a data storage system may read data from disk, compress the data, and write the compressed data back to disk. To read data that has already been compressed, the program may work in the opposite direction, e.g., by fetching compressed data from disk, decompressing the data, and presenting the decompressed data to a requesting program.

SUMMARY

Data storage systems that employ compression generally do so in the background, such as by running a background process or daemon that acts upon already-stored data. Performing compression in the background may result in an over-commitment of storage resources, however, as more storage space than ultimately needed may be used to accommodate initial writes. Also, background compression may entail reading previously-written data from persistent storage and rewriting compressed data back to persistent storage, resulting in a significant increase in disk traffic.

Recent improvements in data storage systems perform data compression in line with storage requests, such that incoming data are compressed prior to the first time they are stored on disk. Inline compression helps to avoid over-commitment of storage resources and to avoid increases in disk traffic.

Inline compression can present new challenges, however. For example, software applications can sometimes write data in units that are smaller than the block size of a file system. An application may write data in units of 4 KB, for example, even though the file system has a block size of 8 KB. When performing inline compression on a 4-KB set of data directed to a particular logical address, the storage system may zero-pad the 4-KB to produce an 8-KB logical block, consistent with the block size of the file system. The storage system may then compress the 8-KB logical block and store the compressed extent in the file system. The file system may pack compressed extents tightly together, to avoid wasting space.

Unfortunately, this process of zero-padding data up to the logical block size of the file system and compressing the zero-padded data can promote fragmentation. For example, an 8-KB zero-padded logical block with only 4 KB of meaningful data can compress down to an extent that is very small, such as 2 KB, which the file system may pack tightly with other data. If an application later issues another write to the same logical address as before, this time specifying 8 KB of meaningful data, no zero padding is performed and compressing the 8 KB is likely to yield a compressed extent that does not fit into the 2-KB footprint occupied by the previous, zero-padded data. As a result, the file system may create a hole where the original compressed extent was stored and allocate new space for the newly compressed data at a new location. Such creation of holes can arise frequently in a file system, significantly increasing fragmentation and impairing storage efficiency.

In contrast with approaches that tend to create holes that result from compressing zero-padded data, an improved technique for performing writes in a storage system supporting data compression tests incoming writes to determine whether the amount of data to be written is less than a predetermined threshold. If so, the storage system avoids compression and stores the amount of data as received without compressing it. If not, the storage system performs compression and stores the incoming data as a compressed extent.

Advantageously, example embodiments avoid creating compressed extents that have storage footprints into which later-arriving data are unlikely to fit. Storage fragmentation is thereby reduced. In addition, embodiments avoid the computational burden of performing data compression and decompression in certain cases where compression provides little or no benefit overall. In cases where compression is avoided, embodiments may still achieve some reduction in consumed storage space by storing, in uncompressed form, only the amount of data actually received. Thus, for example, a storage system may store 4 KB of application data in a 4 KB region, rather than consuming an entire 8-KB file system block to store 4 KB of data.

Certain embodiments are directed to a method of storing data in a file system. The method includes receiving multiple write requests, each of the write requests specifying a respective set of data to be stored in the file system, each set of data having a respective size. In response to a first set of data specified by one of the write requests having a size that equals or exceeds a predetermined threshold, the method further includes (i) performing a compression operation on the first set of data and (ii) storing a compressed version of the first set of data within the file system. In response to a second set of data specified by another of the write requests having a size that falls below the predetermined threshold, the method further includes storing the second set of data in uncompressed form within the file system without performing a compression operation on the second set of data.

Other embodiments are directed to a data storage system constructed and arranged to perform a method of storing data in a file system, such as the method described above. Still other embodiments are directed to a computer program product. The computer program product stores instructions which, when executed on control circuitry of a data storage system, cause the data storage system to perform a method of storing data in a file system, such as the method described above.

The foregoing summary is presented for illustrative purposes to assist the reader in readily grasping example features presented herein; however, the foregoing summary is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same or similar parts throughout the different views.

DETAILED DESCRIPTION OF THE INVENTION

Embodiments of the invention will now be described. It should be appreciated that such embodiments are provided by way of example to illustrate certain features and principles of the invention but that the invention hereof is not limited to the particular embodiments described.

An improved technique for performing writes in a storage system supporting data compression tests incoming writes to determine whether the amount of data to be written is less than a predetermined threshold. If so, the storage system avoids compression and stores the amount of data as received without compressing it. If not, the storage system performs compression and stores the incoming data as a compressed extent.

Figure 1:
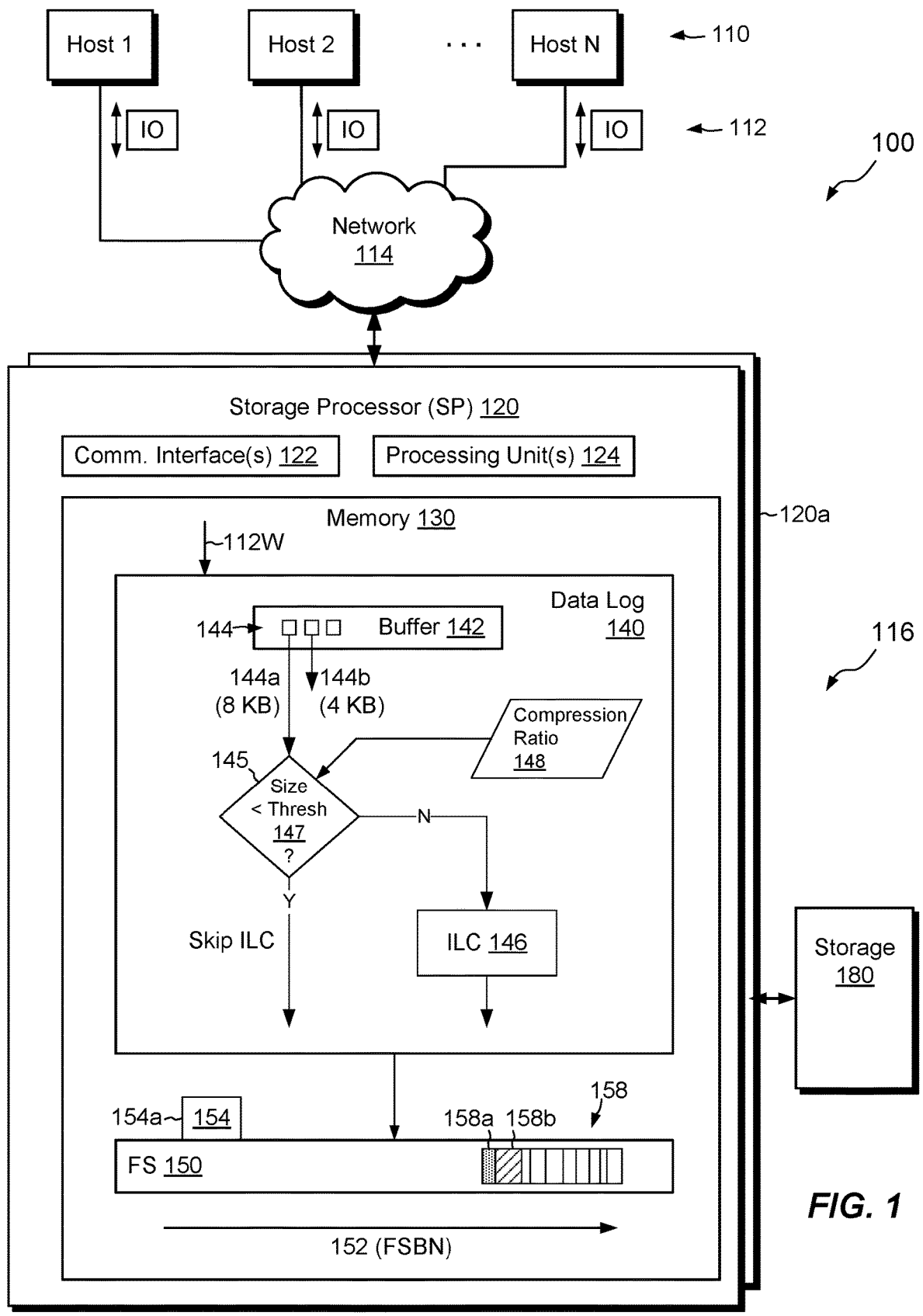
FIG. 1 is a block diagram of an example environment in which embodiments of the improved technique hereof can be practiced.

FIG. 1 shows an example environment 100 in which embodiments of the improved technique hereof can be practiced. Here, multiple host computing devices ("hosts") 110 access a data storage system 116 over a network 114. The data storage system 116 includes a storage processor, or "SP," 120 and storage 180. In an example, the storage 180 includes multiple disk drives, such as magnetic disk drives, electronic flash drives, optical drives, and/or other types of drives.

The data storage system 116 may include multiple SPs like the SP 120 (e.g., a second SP 120a). In an example, multiple SPs may be provided as circuit board assemblies, or "blades," which plug into a chassis that encloses and cools the SPs. The chassis has a backplane for interconnecting the SPs, and additional connections may be made among SPs using cables. It is understood, however, that no particular hardware configuration is required, as any number of SPs may be provided, including a single SP, and the SP 120 can be any type of computing device capable of processing host IOs.

The network 114 may be any type of network or combination of networks, such as a storage area network (SAN), a local area network (LAN), a wide area network (WAN), the Internet, and/or some other type of network or combination of networks, for example. The hosts 110 may connect to the SP 120 using various technologies, such as Fibre Channel, iSCSI, NFS, and CIFS, for example. Any number of hosts 110 may be provided, using any of the above protocols, some subset thereof, or other protocols besides those shown. As is known, Fibre Channel and iSCSI are block-based protocols, whereas NFS and CIFS are file-based protocols. The SP 120 is configured to receive IO requests 112 according to block-based and/or file-based protocols and to respond to such IO requests 112 by reading or writing the storage 180.

The SP 120 includes one or more communication interfaces 122, a set of processing units 124, and memory 130. The communication interfaces 122 include, for example, SCSI target adapters and network interface adapters for converting electronic and/or optical signals received over the network 114 to electronic form for use by the SP 120. The set of processing units 124 includes one or more processing chips and/or assemblies. In a particular example, the set of processing units 124 includes numerous multi-core CPUs. The memory 130 includes both volatile memory, e.g., RAM (Random Access Memory), and non-volatile memory, such as one or more ROMs (Read-Only Memories), disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 are caused to carry out the operations of the software constructs. Although certain software constructs are specifically shown and described, it is understood that the memory 130 typically includes many other software constructs, which are not shown, such as an operating system, various applications, processes, and daemons.

As further shown in FIG. 1, the memory 130 "includes," i.e., realizes by operation of software instructions, a data log 140 and a file system 150. The data log 140 includes a buffer 142 and an in-line compressor (ILC) 146. The file system 150 has a physical address space 152, which ranges, for example, from zero to some large number. The physical address space 152 is denominated in blocks, with each block address identified by File System Block Number, or "FSBN." A "block" is typically the smallest unit of storage space that the file system 150 can allocate. Blocks in the file system 150 are normally uniform in size, with a typical block size being 8 KB, for example, although other block sizes may be used.

The file system 150 defines multiple segments, such as segment 158, where each segment is composed of multiple contiguous blocks, i.e., blocks having consecutive FSBNs. A typical segment size may be 8 blocks, which works out to 64 KB for an 8-KB block size. Different segments may have different sizes.

The data in segment 158 are provided in the form of "extents," i.e., regions within a segment. FIG. 1 identifies two extents 158a and 158b. In this example, extent 158a stores compressed data and extent 158b stores uncompressed data. Although segments are composed of blocks, for storage purposes the file system 150 may treat each segment as one continuous space, packing extents together to avoid wasting space.

Each segment may store data of a particular file in the file system 150. For example, segment 158 stores data of file 154a, which is designated by an inode (index node) 154. In an example, the inode 154 is a data structure that includes information about the file 154a, such as it size and ownership. Inode 154 also stores pointers to data of the file 154a. For example, inode 154 stores direct pointers to data blocks and/or to indirect blocks (IB s), which themselves store arrays of pointers to data of the file 154a. IBs may be arranged in multiple layers, forming an IB tree. IBs that point directly to data blocks of a file are called "leaf Ms."

File system 150 may include additional metadata structures, which, together with the IBs, form metadata paths to data stored within segments. One should appreciate that the file system 150 may include any number of files, each having a respective inode, and any number of segments for each file.

The file 154a has a logical address range, with different logical addresses corresponding to different offsets into the file. Logical addresses may be provided in block-sized increments. For instance, each logical address of file 154a may represent a respective 8-KB increment of storage. Each increment of storage represented by a logical address may be referred to herein as a "logical block." File system metadata structures map logical blocks of files to corresponding physical blocks in the physical address space 152. To support inline compression as well as small allocating writes, the file system 150 may map a logical block to a corresponding extent (e.g., 158a or 158b) within a segment. An extent is typically smaller than a physical block, with the size of the extent reflecting the amount of compression actually achieved or, in the case of small allocating writes, the amount of uncompressed data actually stored. In some examples, the file system 150 also supports storage of data outside of any segments, such as in individual blocks. The file system 150 may store data of logical blocks in respective physical blocks when no inline compression is performed, such as during times of high system workload and/or when arriving data are not compressible.

In example operation, hosts 110 issue IO requests 112 to the data storage system 116. The IO requests 112 direct the data storage system 116 to perform reads and writes of one or more data objects. SP 120 receives the IO requests 112 at communication interface(s) 122 and passes them to memory 130 for further processing. Some of the IO requests 112 specify data writes 112W to file 154a. Buffer 142 receives the data writes 112W and stores the specified data in increments 144. The buffer 142 may be implemented in non-volatile memory, such as DRAM (Dynamic Random Access Memory), and the DRAM may be battery-backed and/or mirrored to SP 120a, such that the data are deemed persisted once they are stored in buffer 142. SP 120 may acknowledge completion of IO requests 112W back to hosts 110 once the data are stored in buffer 142.

In some examples, hosts 110 run one or more applications that issue writes to the data storage system 116 in units that are smaller than the block size of the file system 150. For example, a host application may issue 4-KB writes, while the file system 150 may organize data in 8-KB blocks.

Normally, ILC 146 would obtain data increments 144 from buffer 142, aggregate multiple increments 144, compress the aggregated increments, and flush the compressed data to segments in the file system 150. In accordance with example improvements hereof, the data log 140 tests the sizes of writes and selectively bypasses inline compression if the sizes are less than a predetermined threshold 147.

For example, assume that data increment 144a in the buffer 142 is 8 KB while data increment 144b is only 4 KB. Assume further that the predetermined threshold 147 is 8 KB. For data increment 144a, testing operation 145 compares the size of the data increment 144a to the threshold 147. As the size of the data increment 144a is not less than the threshold 147 (8 KB is not less than 8 KB), inline compression proceeds as normal. But for data increment 144b, its size (4 KB) is less than the threshold 147 (8 KB) so no inline compression is attempted. Rather, the data log 140 aggregates the data increment 144b with other increments 144, some of which may be compressed, and flushes the aggregated data to a segment in the file system 150. In the illustrated example, the file system 150 has stored data increment 144a in extent 158a in compressed form and has stored data increment 144b in extent 158b in uncompressed form. Thus, data from both increments 144a and 144b are stored together in the same segment 158.

Avoiding compression for small allocating writes helps to prevent creation of small compressed extents, which are likely to become holes when larger overwrites to the same locations arrive later. Also, avoiding compression for small allocating writes avoids the need to consume valuable processor resources to compress and decompress data in cases where compression provides little or no benefit. Further, storing data of small allocating writes in extents within segments requires much less storage space than would be needed to store the same data in newly allocated 8-KB blocks, as would normally be done when no inline compression is performed. The overall effect of the improved technique is thus to reduce fragmentation, to reduce demands on processors, and to improve storage utilization.

Although the predetermined threshold 147 is identified above as the size of a block, e.g., 8 KB, one should appreciate that the threshold may be smaller than a block. For example, some applications may write data in 2 KB or even 1 KB increments, such that the threshold 147 could be set to 4 KB, 2 KB, or some other value, for example. In some examples, the data log 140 monitors a compression ratio 148 that ILC 146 achieves on average and varies the threshold 147 accordingly. For example, the data log 140 may decrease the threshold 147 when the compression ratio 148 increases and increase the threshold 147 when the compression ratio 148 decreases. A rationale for varying the threshold 147 based on compression ratio 148 is that higher compression ratios 148 reduce the risk that later-arriving writes will not fit in spaces occupied by uncompressed extents.

Figure 2:
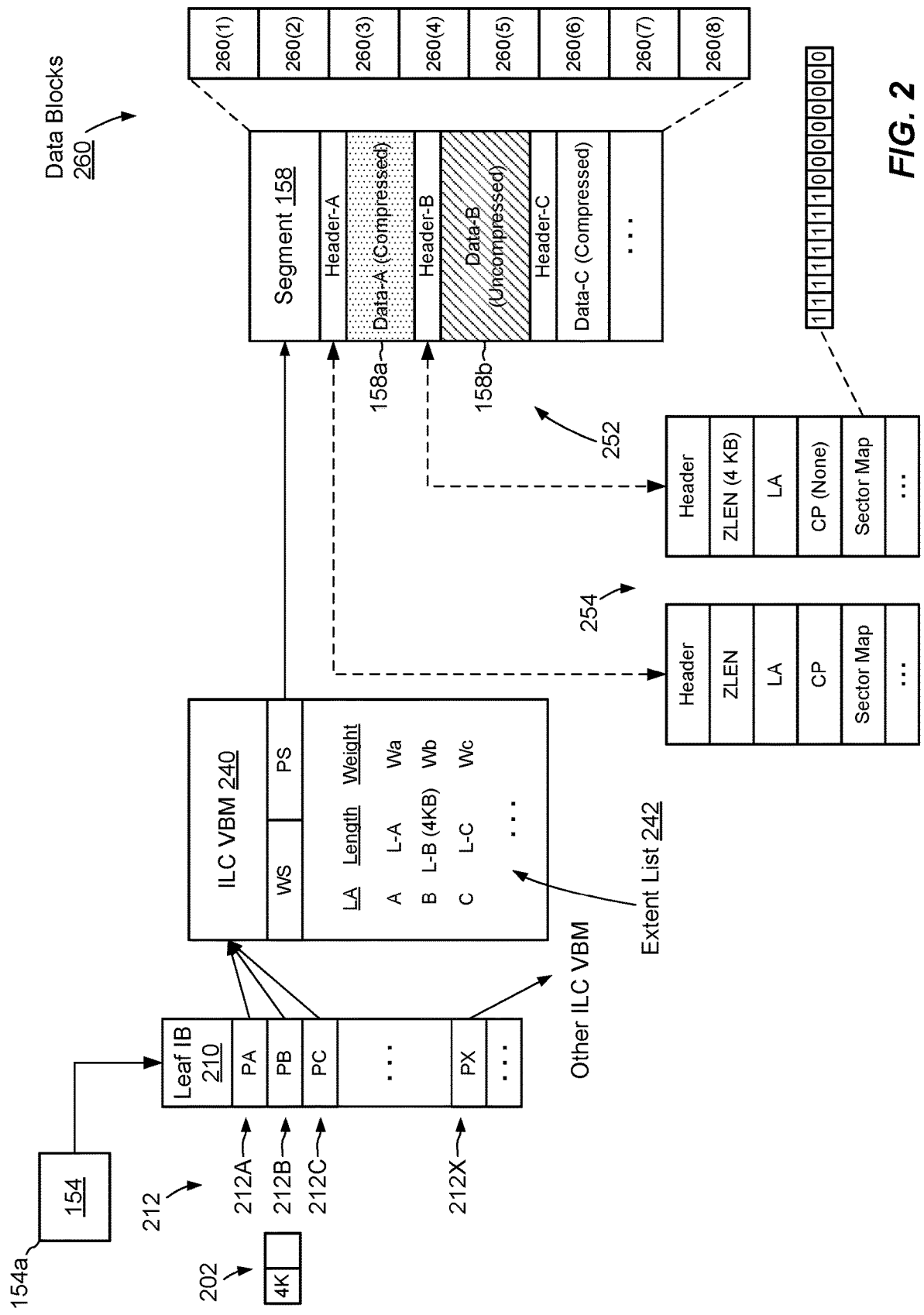
FIG. 2 is a block diagram showing an example metadata arrangement that supports storage of both compressed and uncompressed data in a file system of FIG. 1.

FIG. 2 shows example metadata structures that support mapping of logical blocks to extents of data in segment 158. The metadata structures include inode 154, leaf IB (Indirect Block) 210, and a VBM (virtual block map), such as ILC (in-line compression) VBM 240. Leaf IB 210 includes block pointers 212, which map logical addresses of the file 154a to other metadata structures or to data blocks in the file system 150. For example, block pointers 212A, 212B, and 212C map logical addresses A, B, and C to ILC VBM 240. In addition, leaf IB 210 may include additional block pointers 212 that also point to ILC VBM 240 for addressing other extents of compressed data in segment 158. Leaf IB 210 may store additional block pointers, such as pointer 212X, which point to other ILC VBMs. Leaf IB 210 may further store pointers (not shown) that point directly to data blocks. Leaf IB 210 may include any number of block pointers, a typical number being 1024.

In the example shown, ILC VBM 240 has a weight WS and a pointer PS. The weight WS indicates the number of block pointers that point to the ILC VBM 240, and the pointer PS points to the physical address (FSBN) of the segment 158, which by convention may be selected to be the address of the first data block in segment 158. The ILC VBM 240 also has an extent list 242. Extent list 242 describes the contents of segment 158 and relates, for each extent of data, the logical address (LA) of that item in the file (e.g., A, B, or C), a length (L-A, L-B, or L-C, e.g., in bytes) of that data in the segment 158, and a weight (Wa, Wb, or Wc). In an example, the sum of weights of extents in the extent list 242 equals the total weight WS of the ILC VBM 240.

Segment 158 is composed of contiguous data blocks 260, i.e., blocks 260(1) through 260(8). For purposes of storing data, boundaries between blocks 260(1) through 260(8) may be ignored and the file system 150 may treat the segment 158 as one continuous space.

The detail shown in segment 158 indicates an example layout 252 of compressed extents. Each extent has an associated header 254. For instance, Header-A can be found at Loc-A immediately before compressed Data-A. Likewise, Header-B can be found at Loc-B immediately before compressed Data-B. Similarly, Header-C can be found at Loc-C immediately before compressed Data-C. In this example, Data-A is the compressed extent 158a formed by compressing the 8-KB data increment 144a (FIG. 1). Data-B is the uncompressed extent 158b formed by directly storing the 4-KB data increment 144b.

Headers 254 are shown for illustration and are intended to be representative of all headers in segment 158 (or in any segment). Each header 254 stores metadata that pertains to a respective extent. In an example, each header 254 is a fixed-size data structure that includes multiple metadata elements, such as the following:

ZLEN: the length of the corresponding extent of data; e.g., in bytes.

LA: the logical address (e.g., A, B, C, and so on) of the corresponding extent of data within the file 154a.

CP: a compression procedure (or algorithm) used to compress the data, such as LZ-L3, LZH-L4, "Hardware," and so on. May indicate "None" if the extent stores uncompressed data.

Sector Map: A data structure, such as a bitmap, which identifies the sectors that the data of the extent occupy in a logical block. For example, the sector map has its first eight locations set to "1" and the rest set to "0" if the data stored in the extent describe the first 4 KB (first 8 sectors) of a logical block. The sector map is relevant for uncompressed extents only.

The headers 254 may include additional elements, such as CRC (Cyclic Redundancy Check) and various flags.

In the example shown, extent 158b (Data-B) stores the first 4-KB of a logical block 202 (shown at left). The second 4 KB of logical block 202 is empty or designated as all zeros. Rather than storing the entire 8-KB of logical block 202 in extent 158b, the segment 178 stores only the first 4 KB, as only the first 4 KB have meaningful data. To indicate this arrangement, the sector map of Header-B has each of its first 8 bits set to "1" and each of its second 8 bits set to "0." One should appreciate that the sector map may be implemented using other types of data structures. A bitmap is merely an example.

Figure 3:
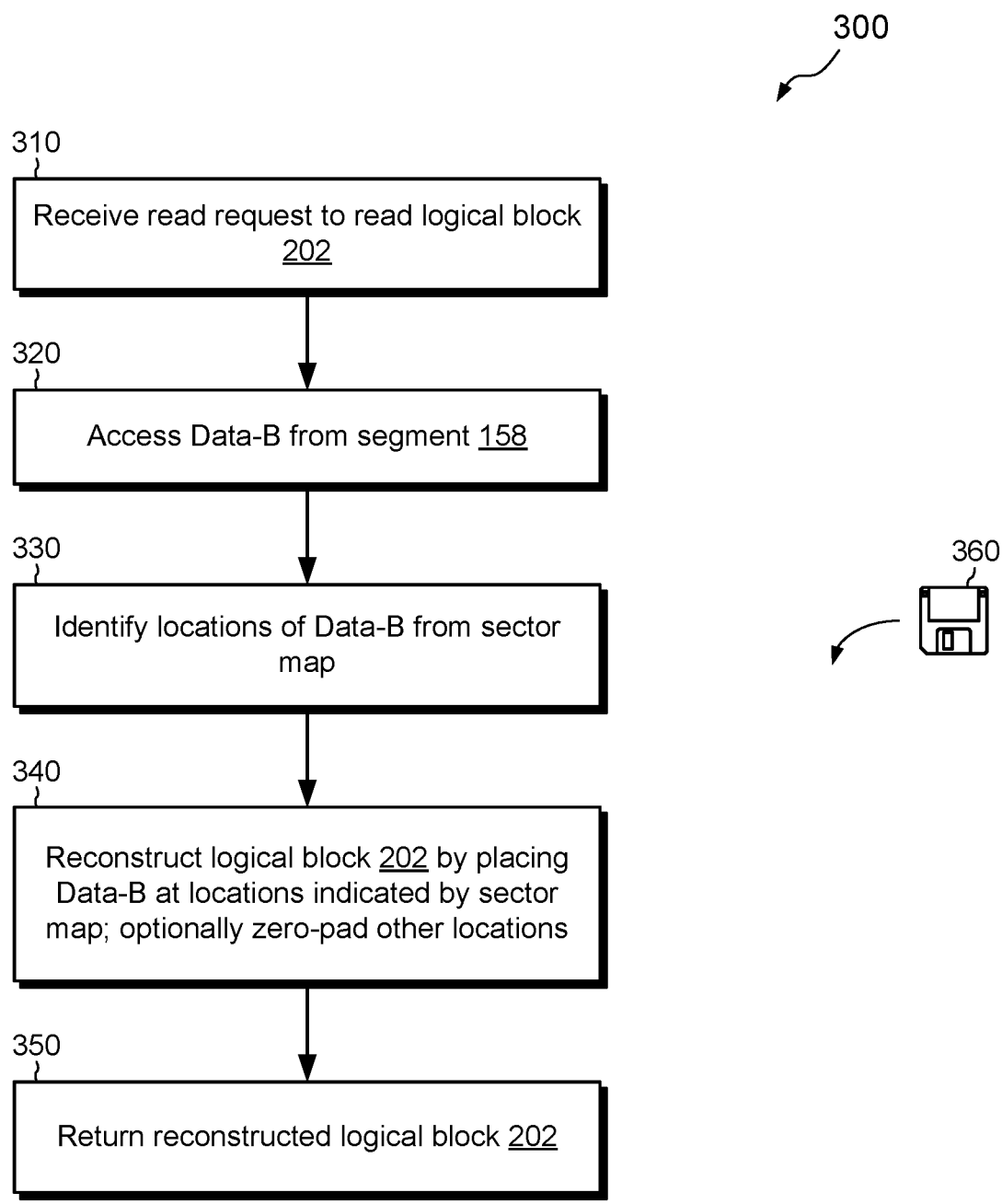
FIG. 3 is a flow chart showing an example method of reading uncompressed data using the metadata arrangement of FIG. 2.

FIG. 3 shows an example method 300 for responding to a request to read data of logical block 202. The method 300 may be performed, for example, by the software constructs shown in FIG. 1, which may be stored within the memory 130 and operated by the set of processing units 124.

At 310, a read request is received to read the logical block 202. For example, the data storage system 116 receives an IO request 112 from an application running on one of the hosts 110. The IO request 112 specifies a read of logical block 202.

At 320, the file system 150 accesses Data-B from the segment 158. For example, the file system 150 maps the read request to segment 158 via inode 154, leaf IB 210, and ILC VBM 240, and uses the extent list 242 in ILC VBM 240 to look up Data-B in the segment 158.

At 330, the file system 150 identifies locations of Data-B within the logical block 202 using the sector map stored in Header-B. For example, if the first 8 bits of the sector map are set to "1" and the rest are set to "0," the file system 150 identifies the location of Data-B as the first 4 KB of logical block 202.

At 340, the file system 150 reconstructs logical block 202 by placing Data-B at the locations indicated by the sector map in Header-B. Depending on implementation, the file system 150 may zero-pad the remaining locations of the reconstructed logical block 202, i.e., those locations for which the sector map is set to zero.

At 350, the file system 150 returns the reconstructed logical block 202 to the requesting entity, such as the host application that issued the read request.

Figure 4:
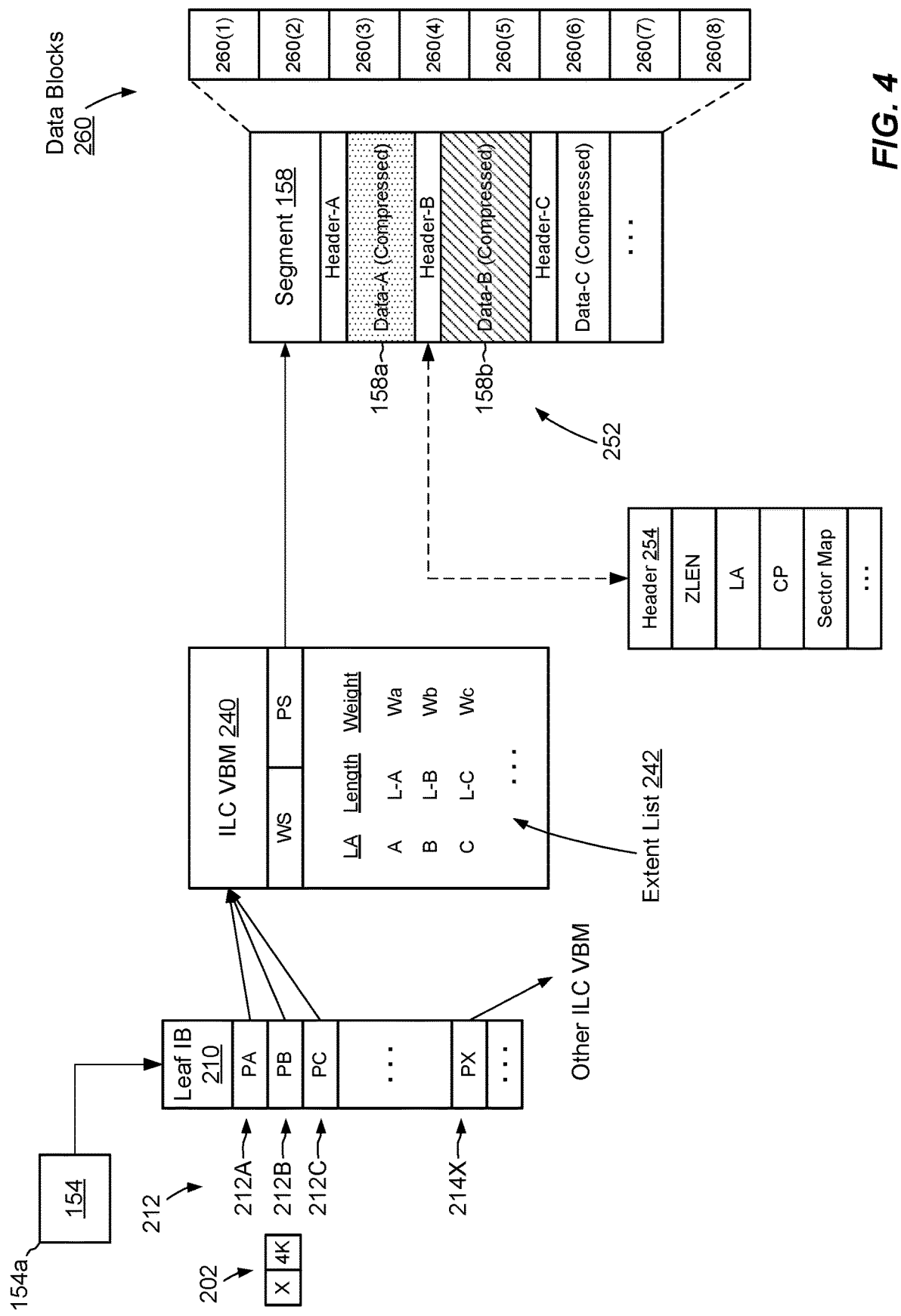
FIG. 4 is a block diagram showing the example metadata arrangement of FIG. 2 after an uncompressed extent of data is overwritten in place with compressed data.

FIG. 4 shows the same arrangement as in FIG. 2, but after an overwrite has been performed on logical block 202. Here, for example, an application has issued a 4-KB write to the second 4-KB portion of logical block 202. To execute the write, the file system 150 reads the uncompressed data from extent 158b and combines it with the newly arriving 4-KB portion of data, being sure to preserve order, such that the original data occupies the first 4 KB and the new data occupies the second 4 KB. The file system 150 then compresses the 8 KB of combined data and stores the compressed version of the data in place back in the extent 158b. The file system 150 updates Header-B to indicate that the data are compressed, e.g., by specifying the compression procedure (CP) used. The sector map is cleared or ignored, as it is no longer relevant to the compressed data. The compressed 8-KB logical block 202 most likely fits within the extent 158b, as long as 2:1 or better compression ratio can be achieved on the combined data. Creation of a hole his therefore avoided.

Figure 5:
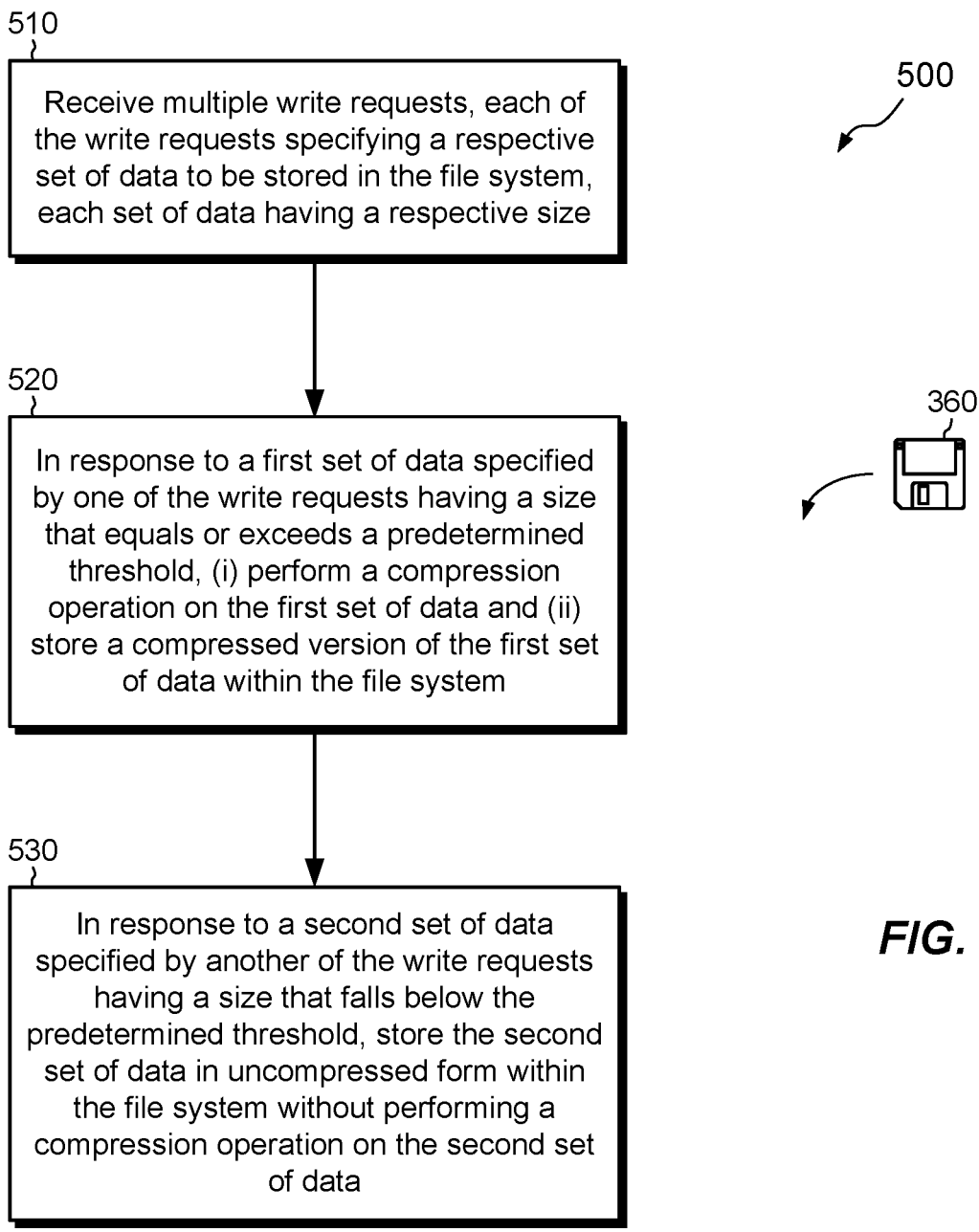
FIG. 5 is a flowchart showing an example method of storing data in a file system.

FIG. 5 shows an example method 500 that may be carried out in connection with the environment 100. The method 500 is typically performed, for example, by the software constructs shown in FIG. 1, which reside in the memory 130 of the storage processor 120 and are run by the set of processing units 124. The various acts of method 500 may be ordered in any suitable way. Accordingly, embodiments may be constructed in which acts are performed in orders different from that illustrated, which may include performing some acts simultaneously.

At 510, multiple write requests 112W are received, each of the write requests 112W specifying a respective set of data 144 to be stored in the file system 150, each set of data 144 having a respective size.

At 520, in response to a first set of data 144a specified by one of the write requests 112W having a size that equals or exceeds a predetermined threshold 147, (i) a compression operation is performed on the first set of data and (ii) a compressed version of the first set of data 144a is stored within the file system 150.

At 530, in response to a second set of data 144b specified by another of the write requests 112W having a size that falls below the predetermined threshold 147, the second set of data 144b is stored in uncompressed form within the file system 150 without performing a compression operation on the second set of data 144b.

An improved technique has been described for performing writes in a storage system 116 supporting inline compression. The technique tests incoming writes 112W to determine whether the amount of data to be written is less than a predetermined threshold 147. If so, the storage system 116 avoids inline compression and stores the amount of data as received without compressing it. If not, the storage system 146 performs inline compression and stores the incoming data as a compressed extent.

Having described certain embodiments, numerous alternative embodiments or variations can be made. For example, although certain metadata structures are shown and described, these are merely examples, as other types of metadata structures may also be used.

Also, embodiments have been described in connection with inline compression. However, similar techniques may be used when performing background compression. Thus, embodiments hereof are limited to inline compression.

Further, although embodiments have been described in which host applications write in 4-KB increments, the principles as described herein apply to any size data increments, provided they are smaller than a block size of the file system 150.

Further, although features are shown and described with reference to particular embodiments hereof, such features may be included and hereby are included in any of the disclosed embodiments and their variants. Thus, it is understood that features disclosed in connection with any embodiment are included as variants of any other embodiment.

Further still, the improvement or portions thereof may be embodied as a computer program product including one or more non-transient, computer-readable storage media, such as a magnetic disk, magnetic tape, compact disk, DVD, optical disk, flash drive, solid state drive, SD (Secure Digital) chip or device, Application Specific Integrated Circuit (ASIC), Field Programmable Gate Array (FPGA), and/or the like (shown by way of example as medium 360 in FIGS. 3 and 5). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and that the invention is not limited to these particular embodiments.

Those skilled in the art will therefore understand that various changes in form and detail may be made to the embodiments disclosed herein without departing from the scope of the invention.

What is claimed is:

1. A method of storing data in a file system, the method comprising:

receiving multiple write requests directed to a file of the file system, each of the write requests specifying a respective set of data to be stored in the file of the file system, each set of data having a respective size;

in response to a first set of data specified by one of the write requests to the file having an uncompressed size that equals or exceeds a predetermined threshold, (i) performing a compression operation on the first set of data and (ii) storing a compressed version of the first set of data within the file system; and in response to a second set of data specified by another of the write requests to the file having an uncompressed size that falls below the predetermined threshold, storing the second set of data in uncompressed form within the file system without performing a compression operation on the second set of data, wherein the file system includes (i) an address space for arranging blocks, each block providing a unit of allocatable space in the file system, and (ii) multiple segments, each segment including a distinct set of multiple contiguous blocks in the address space, and wherein the first set of data and the second set of data are stored together within a particular segment of the multiple segments, wherein the method further comprises dynamically adjusting the predetermined threshold based on compression ratios achieved for compressed data in the file system, including decreasing the predetermined threshold in response to detecting higher compression ratios and increasing the predetermined threshold in response to detecting lower compression ratios.

2. The method of claim 1, wherein the particular segment includes multiple blocks having a uniform block size, and wherein the predetermined threshold does not exceed the uniform block size.

3. The method of claim 2, wherein storing the second set of data in uncompressed form is performed without zero-padding the second set of data, such that the second set of data occupies an amount of space in the particular segment that is less than the predetermined threshold.

4. The method of claim 2, further comprising:

storing a first compression header in the particular segment, the first compression header providing first metadata pertaining to the first set of data and storing an indication that the first set of data is compressed; and storing a second compression header in the particular segment, the second compression header providing second metadata pertaining to the second set of data and storing an indication that the second set of data is uncompressed.

5. The method of claim 4, wherein, when receiving the write requests, the second set of data is addressed to a particular range within a logical block of a file in the file system, and wherein storing the second compression header includes identifying, within the second compression header, the particular range to which the second set of data is addressed within the logical block.

6. The method of claim 5, wherein identifying the particular range to which the second set of data is addressed within the logical block includes providing a sector map of the logical block, the sector map indicating, for each sector location of the logical block, whether that sector location includes at least part of the second set of data.

7. The method of claim 6, further comprising:
receiving a read request to read the logical block;
accessing the second set of data from the particular segment;
identifying, from the sector map, a set of sector locations in the logical block that include the second set of data; and
returning a reconstructed logical block in response to the read request, the reconstructed logical block including (i) the second set of data at the sector locations indicated by sector map and (ii) zeros elsewhere.

8. The method of claim 4, wherein the second set of data occupies a particular region within the particular segment, and wherein the method further comprising:
receiving a write request specifying a third set of data to be stored in the file system, the third set of data addressed to a second range within the logical block;
producing a combined set of data that includes both the second set of data and the third set of data;
generating a compressed version of the combined set of data; and
storing the compressed version of the combined set of data within the particular region of the particular segment.

9. The method of claim 8, further comprising updating the second compression header to indicate that the combined set of data stored in the particular region of the particular segment is compressed.

10. A data storage system, comprising control circuitry that includes a set of processing units coupled to memory, the control circuitry constructed and arranged to:
receive multiple write requests directed to a file of the file system, each of the write requests specifying a respective set of data to be stored in the file of the file system, each set of data having a respective size;
in response to a first set of data specified by one of the write requests to the file having an uncompressed size that equals or exceeds a predetermined threshold, (i) perform a compression operation on the first set of data and (ii) store a compressed version of the first set of data within the file system; and
in response to a second set of data specified by another of the write requests to the file having an uncompressed size that falls below the predetermined threshold, store the second set of data in uncompressed form within the file system without performing a compression operation on the second set of data.

11. A computer program product including a set of non-transitory, computer-readable media having instructions which, when executed by control circuitry of a data storage system, cause the control circuitry to perform a method for storing data, the method comprising:
receiving multiple write requests directed to a file of the file system, each of the write requests specifying a respective set of data to be stored in the file of the file system, each set of data having a respective size;
in response to a first set of data specified by one of the write requests to the file having an uncompressed size that equals or exceeds a predetermined threshold, (i) performing a compression operation on the first set of data and (ii) storing a compressed version of the first set of data within the file system; and
in response to a second set of data specified by another of the write requests to the file having an uncompressed size that falls below the predetermined threshold, storing the second set of data in uncompressed form within the file system without performing a compression operation on the second set of data.

12. The computer program product of claim 11, wherein the file system includes (i) an address space for arranging blocks, each block providing a unit of allocatable space in the file system, and (ii) multiple segments, each segment including a distinct set of multiple contiguous blocks in the address space, and wherein the first set of data and the second set of data are stored together within a particular segment of the multiple segments, and wherein the particular segment includes multiple blocks having a uniform block size, and wherein the predetermined threshold does not exceed the uniform block size.

13. The computer program product of claim 12, wherein storing the second set of data in uncompressed form is performed without zero-padding the second set of data, such that the second set of data occupies an amount of space in the particular segment that is less than the predetermined threshold.

14. The computer program product of claim 12, wherein the method further comprises:
storing a first compression header in the particular segment, the first compression header providing first metadata pertaining to the first set of data and storing an indication that the first set of data is compressed; and
storing a second compression header in the particular segment, the second compression header providing second metadata pertaining to the second set of data and storing an indication that the second set of data is uncompressed.

15. The method of claim 14, wherein, when receiving the write requests, the second set of data is addressed to a particular range within a logical block of a file in the file system, and wherein storing the second compression header includes identifying, within the second compression header, the particular range to which the second set of data is addressed within the logical block.

16. The computer program product of claim 14, wherein identifying the particular range to which the second set of data is addressed within the logical block includes providing a sector map of the logical block, the sector map indicating, for each sector location of the logical block, whether that sector location includes at least part of the second set of data.

17. The computer program product of claim 16, wherein the method further comprises:
receiving a read request to read the logical block;
accessing the second set of data from the particular segment;
identifying, from the sector map, a set of sector locations in the logical block that include the second set of data; and
returning a reconstructed logical block in response to the read request, the reconstructed logical block including (i) the second set of data at the sector locations indicated by sector map and (ii) zeros elsewhere.

18. The method of claim 1, further comprising:
receiving additional data for writing to the file of the file system, the additional data including a first plurality of data sets each being at least as large as the predetermined threshold and a second plurality of data sets each being smaller than the predetermined threshold;
selectively compressing each of the first plurality of data sets; and
selectively avoiding compression for each of the second plurality of data sets,
wherein selectively avoiding compression for each of the second plurality of data sets avoids creation of storage regions that have a high likelihood of becoming holes upon subsequent overwrites.

\* \* \* \* \*